United States Patent

Kamiya

[11] Patent Number: 6,107,831
[45] Date of Patent: Aug. 22, 2000

[54] LEVEL CONVERSION CIRCUIT

[75] Inventor: Hiroshi Kamiya, Tokyo, Japan

[73] Assignee: NEC Corporation, Tokyo, Japan

[21] Appl. No.: 09/116,211

[22] Filed: Jul. 16, 1998

[30] Foreign Application Priority Data

Jul. 18, 1997 [JP] Japan .................................. 9-193531

[51] Int. Cl.⁷ .......................................... H03K 19/0175
[52] U.S. Cl. .............................................. 326/80; 326/63
[58] Field of Search .................................. 326/21, 29, 62, 326/63, 80; 327/333

[56] References Cited

U.S. PATENT DOCUMENTS 5,352,942  10/1994  Tanaka et al. .......................... 307/475

FOREIGN PATENT DOCUMENTS

| 57-19839 | 2/1982 | Japan . |
| 58-12042 | 1/1983 | Japan . |
| 61-272820 | 12/1986 | Japan . |
| 63-216127 | 9/1988 | Japan . |
| 64-76211 | 3/1989 | Japan . |
| 1-298410 | 12/1989 | Japan . |
| 2-211517 | 8/1990 | Japan . |
| 4-143820 | 5/1992 | Japan . |
| 8-286795 | 11/1996 | Japan . |
| 9-34608 | 2/1997 | Japan . |

*Primary Examiner*—Michael Tokar
*Assistant Examiner*—Thanh-Tam Le
*Attorney, Agent, or Firm*—Sughrue, Mion, Zinn, Macpeak & Seas, PLLC

[57] ABSTRACT

A level conversion circuit of the present invention is connected between a first and a second device respectively operable with a first and a second power source voltage different from each other. A first wave shaping element shapes the waveform of a signal output from the output of the first device. A waveform transferring element transfers a signal output from the first wave shaping element to the second device. A level determining element controls the level of a signal to be input to the second device. A second wave shaping element shapes the waveform of a signal having a level determined by the level determining element. With this configuration, the circuit is capable of transferring a waveform from the first device to the second device rapidly and thereby protecting the devices from damage.

7 Claims, 2 Drawing Sheets

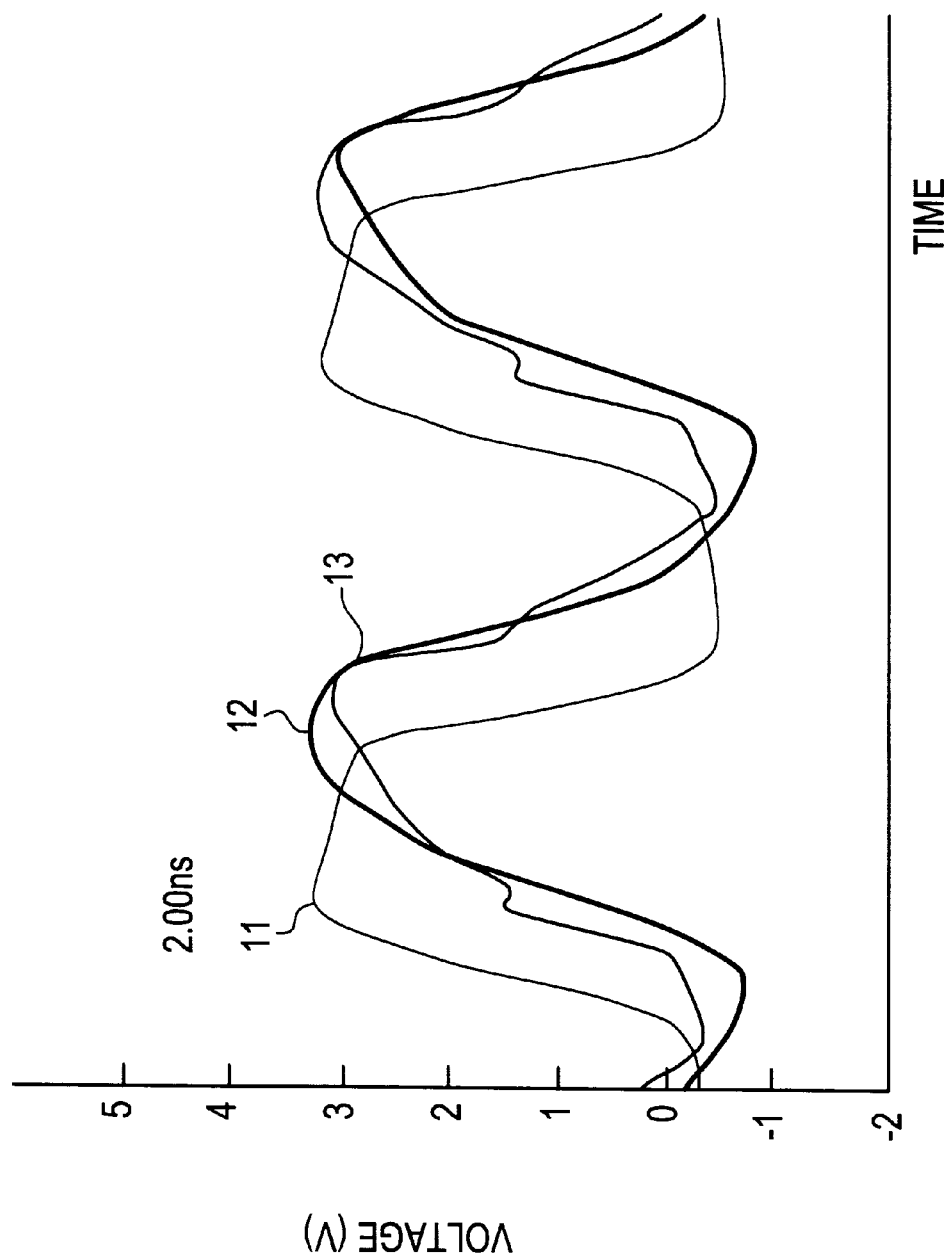

ID NO. 6,107,831

LEVEL CONVERSION CIRCUIT

BACKGROUND OF THE INVENTION

The present invention relates to a level conversion circuit for effecting signal level conversion between two devices each being operable with a particular power source voltage. More particularly, the present invention is concerned with a level conversion circuit for connecting devices respectively operable with a power source voltage of 3.3 V and a power source voltage of 2.5 V.

Japanese Patent Laid-Open Publication No. 9-34608, for example, discloses an interface circuit which is a specific form of a level conversion circuit. The interface circuit includes a voltage monitoring circuit for determining whether or not the power source voltage of a first circuit or that of a second circuit operable with a different voltage from the first circuit has exceeded a preselected voltage. In response to the result of this decision, a signal switching circuit selects either one of a first and a second signal path. As a result, a signal is input and output via the first signal path or a level conversion circuit included in the second signal path. This implements signal transfer between the first and second circuits when the power source voltage does not exceed the preselected voltage.

The above conventional interface circuit is able to convert a low power source voltage to a high power source voltage, but unable to convert a signal level such that, e.g., a signal output from a 3.3 V device operable with a power source voltage of 3.3 V can be input to a 2.5 V device operable with a lower power source voltage of 2.5 V. Should the 3.3 V device be directly connected to the 2.5 V device, a piercing current would flow and damage the 2.5 V device.

Technologies relating to the present invention are also disclosed in, e.g., Japanese Patent Laid-Open Publication Nos. 57-19839, 58-12042, 61-272820, 63-216127, 64-76211, 1-298410, 2-211517, 4-143820, and 8-286795.

SUMMARY OF THE INVENTION

It is therefore an object of the present invention to provide a level conversion circuit capable of transferring a waveform between two devices different in operable power source voltage rapidly with a simple configuration and protecting them from damages.

A level conversion circuit of the present invention is connected between a first and a second device respectively operable with a first and a second power source voltage different from each other. A first wave shaping element shapes the waveform of a signal output from the output of the first device. A waveform transferring element transfers a signal output from the first wave shaping element to the second device. A level determining element controls the level of a signal to be input to the second device. A second wave shaping element shapes the waveform of a signal having a level determined by the level determining element. With this configuration, the circuit is capable of transferring a waveform from the first device to the second device rapidly and thereby protecting the devices from damage.

BRIEF DESCRIPTION OF THE DRAWINGS

The above and other objects, features and advantages of the present invention will become apparent from the following detailed description taken with the accompanying drawings in which:

FIG. 2 is a graph showing specific waveforms appearing in the illustrative embodiment.

DESCRIPTION OF THE PREFERRED EMBODIMENT

Figure 1:
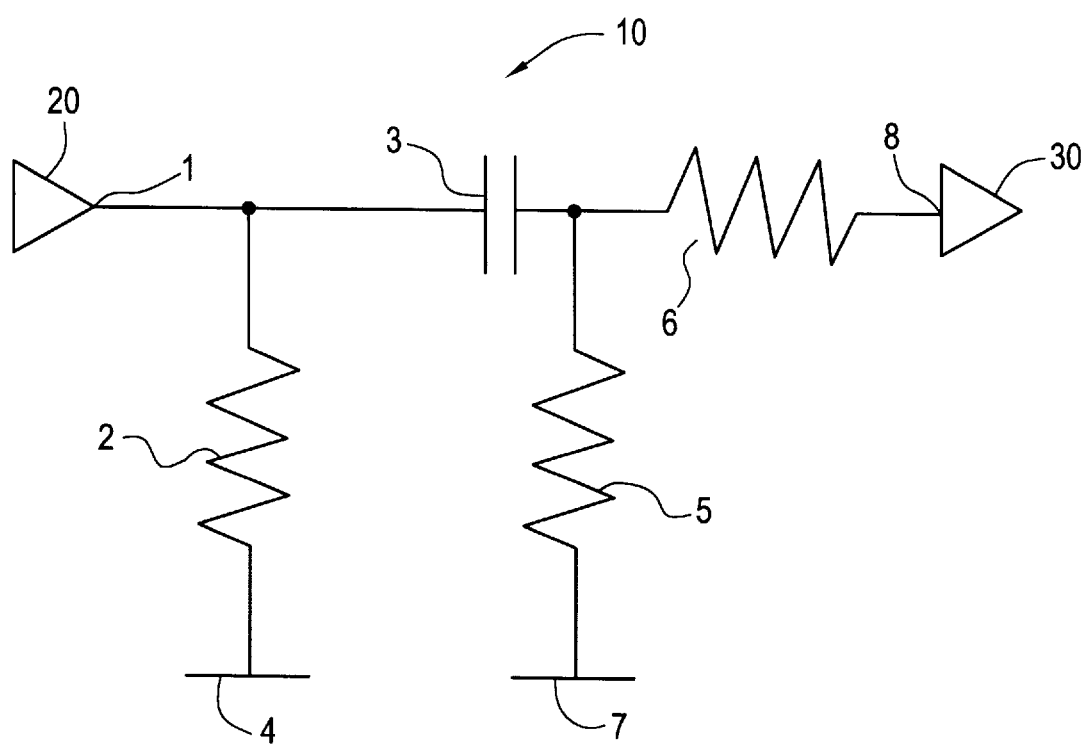
FIG. 1 is a circuit diagram showing a level conversion circuit embodying the present invention.

Referring to FIG. 1 of the drawings, a level conversion circuit embodying the present invention is shown and generally designated by the reference numeral 10. As shown, the level conversion circuit 10 includes a terminal resistor or first wave shaping means 2 and a capacitive part or waveform transferring means 3. One end of the terminal terminal 2 and one end of the capacitive part 3 are connected to the output 1 of a 3.3 V device 20 operable with a first power source voltage of 3.3 V. A terminal potential 4 is connected to the other end of the terminal resistor 2. A pull-up resistor or level determining means 5 and a series resistor or second wave shaping means 6 each is connected to the other end of the capacitive part 3 at one end thereof. A pull-up potential 7 is connected to the other end of the pull-up resistor 5. The other end of the series resistor 6 is connected to the input 8 of a 2.5 V device operable with a second power source voltage of 2.5 V. With this configuration, the circuit 10 converts the level of the 3.3 V device 20 to the level of the 2.5 V device 30.

In a specific configuration, the 3.3 V device 20 was implemented as a general-purpose device. The terminal resistor 2 had a resistance of 188 Ω. The terminal potential 4 connected to the terminal resistor 2 was selected to be 3.48 V. The capacitive part 3 had a capacity of 0.1 μF. The pull-up resistor 5 and pull-up potential 7 respectively had a resistance of 390 Ω and a potential of 1.25 V. Further, the series resistor 6 had a resistance of 12 Ω.

In operation, the terminal resistor 2 shapes the waveform of a 100 MHz signal output from the output 1 of the 3.3 V device 20. The shaped waveform is applied to one end of the capacitive part 3 with the result that an AC component included in the shaped waveform is transferred to the other end of the capacitive part 3. The waveform of the AC component has an amplitude in both of the positive and negative directions with respect to the pull-up potential 7. Such a waveform is fed to the series resistor 6 and then to the input 8 of the 2.5 V device 30.

FIG. 2 shows a waveform applied to the input 8 of the 2.5 V device 30 and observed on an oscilloscope. Specifically, a curve 11 shows a waveform input to the capacitive part 3 while a curve 12 shows a waveform input to the series resistor 6. A curve 13 shows a waveform input to the 2.5 V device 30. As FIG. 2 indicates, a signal shaped in waveform is input to the 2.5 V device 30.

For comparison, assume that the output 1 of the 3.3 V device 20 is directly connected to the input 8 of the 2.5 V device 30 without the intermediary of the level conversion circuit 10, and that a high side clamp diode is connected to the input 8 of the 2.5 V device 30. Then, when the 3.3 V device 20 outputs a high potential, a piercing current flows from the device 20 to the device 30 and is apt to damage the device 30. The level conversion circuit 10 obviates such an occurrence because it does not connect the devices 20 and 30 with respect to DC.

In summary, it will be seen that the present invention provides a level conversion circuit capable of transferring a waveform from a first device to a second device rapidly and thereby protecting the devices from damage. This advantage is derived from a unique configuration in which a terminal resistor or first wave shaping means and a capacitive part or waveform transferring means each has one end thereof connected to the output of a first device operable with a first power source voltage of 3.3 V. A terminal potential is connected to the other end of the terminal resistor. A pull-up resistor or level determining means and a series resistor or second wave shaping means each is connected to the other end of the capacitive part at one end thereof. A pull-up potential is connected to the other end of the pull-up resistor. The other end of the series resistor is connected to the input of a second device operable with a second power source voltage.

Various modifications will become possible for those skilled in the art after receiving the teachings of the present disclosure without departing from the scope thereof.

What is claimed is:

1. A level conversion circuit connected between a first and second device respectively operable with a first and a second power source voltage different from each other, said level conversion circuit comprising:

first wave shaping means for shaping a waveform of a signal output from an output of the first device;

waveform transferring means for transferring a signal output from said first wave shaping means to the second device;

level determining means for controlling a level of a signal to be input to the second device; and second wave shaping means for shaping a waveform of a signal having a level determined by said level determining means, wherein said first power source voltage and said second power source voltage are 3.3 V and 2.5 V, respectively.

2. A circuit as claimed in claim 1, wherein said first wave shaping means comprises a terminal resistor connected to the output of the first device at one end thereof, wherein said waveform transferring means comprises a capacitive part connected at one end thereof to said output of said first device together with said one end of said terminal resistor, wherein said level determining means comprises a pull-up resistor connected at one end thereof to the other end of said capacitive part, and wherein said second wave shaping means comprises a series resistor connected at one end thereof to the other end of said capacitive part together with said one end of said pull-up resistor and connected at the other end thereof to the input of the second device.

3. A circuit as claimed in claim 2, wherein a terminal potential is connected to the other end of said terminal resistor.

4. A circuit as claimed in claim 3, wherein the other end of said pull-up resistor is connected to a pull-up potential.

5. A level conversion circuit connected between a first and second device respectively operable with a first and a second power source voltage different from each other, said level conversion circuit comprising:

first wave shaping means for shaping a waveform of a signal output from an output of the first device;

waveform transferring means for transferring a signal output from said first wave shaping means to the second device;

level determining means for controlling a level of a signal to be input to the second device; and second wave shaping means for shaping a waveform of a signal having a level determined by said level determining means, wherein said first wave shaping means comprises a terminal resistor connected to the output of the first device at one end thereof, wherein said waveform transferring means comprises a capacitive part connected at one end thereof to said output of said first device together with said one end of said terminal resistor, wherein said level determining means comprises a pull-up resistor connected at one end thereof to the other end of said capacitive part, and wherein said second wave shaping means comprises a series resistor connected at one end thereof to the other end of said capacitive part together with said one end of said pull-up resistor and connected at the other end thereof to the input of the second device.

6. A circuit as claimed in claim 5, wherein a terminal potential is connected to the other end of said terminal resistor.

7. A circuit as claimed in claim 6, wherein the other end of said pull-up resistor is connected to a pull-up potential.

* * * * *